(12) United States Patent
Overweg et al.

(10) Patent No.: US 6,462,636 B1
(45) Date of Patent: Oct. 8, 2002

(54) MR APPARATUS

(75) Inventors: Johannes Adrianus Overweg, Uelzen (DE); Carsten Warmuth, Hamburg (DE); Christoph Günther Leussler, Hamburg (DE); Peter Karl Hermann Röschmann, Hamburg (DE)

(73) Assignee: Koninklijke Philips Electronics N.V., Eindhoven (NL)

(*) Notice: Subject to any disclaimer, the term of this patent is extended or adjusted under 35 U.S.C. 154(b) by 8 days.

(21) Appl. No.: 09/709,268

(22) Filed: Nov. 9, 2000

(30) Foreign Application Priority Data

Nov. 9, 1999 (DE) .......................... 199 53 748

(51) Int. Cl.[7] .................................................. G01V 3/00
(52) U.S. Cl. ..................... 335/299; 324/318; 600/422
(58) Field of Search ..................... 324/318, 319, 324/320; 335/216, 296–306; 600/410, 415, 421, 422

(56) References Cited

U.S. PATENT DOCUMENTS

5,543,711 A * 8/1996 Srinivasan et al. ......... 324/318

FOREIGN PATENT DOCUMENTS

EP 0313213 A2 9/1988 .......... G01N/24/08

* cited by examiner

Primary Examiner—Ramon M. Barrera
(74) Attorney, Agent, or Firm—John Vodopia

(57) ABSTRACT

The invention relates to an MR apparatus which includes
a cylindrical main field magnet for generating a uniform, steady magnetic field whose cylindrical shape defines a symmetry axis,
a gradient coil system which encloses the symmetry axis and includes a plurality of gradient coils,
an RF coil system which is situated inside the gradient coil system and includes a plurality of mutually offset conductors which extend parallel to the symmetry axis, and
a table top for accommodating an object to be examined.

8 Claims, 2 Drawing Sheets

MR APPARATUS

BACKGROUND OF THE INVENTION

The invention relates to an MR apparatus which includes
- a cylindrical main field magnet for generating a uniform, steady magnetic field whose cylindrical shape defines a symmetry axis,
- a gradient coil system which encloses the symmetry axis and includes a plurality of gradient coils,
- an RF coil system which is situated inside the gradient coil system and includes a plurality of mutually offset conductors which extend parallel to the symmetry axis, and
- a table top for accommodating an object to be examined.

The invention also relates to a combination of a gradient coil system and an RF coil system which is suitable for use in an MR apparatus.

The electric power required for feeding a gradient coil is dependent not only on the speed at which the current through the gradient coil is switched and off, but also on the diameter of the coil; that is, the necessary electric power increases approximately as the fifth power of the diameter. Therefore, the inner diameter of the gradient coil system generally is chosen to be so large that the RF shield which is situated directly on the inner side of the gradient coil system and serves to shield the RF coil from the environment is situated at an adequate distance therefrom. If the inner diameter of the gradient coil system, and hence the distance between the RF shield situated therein and the RF coil system, were reduced, the electric power required for feeding the gradient coils would be further reduced, but the power required for feeding the RF coil would be increased. The gradient coil customarily has a circular inner contour which matches the shape of the RF coil whose conductors which extend parallel to the symmetry axis are arranged on a circle around the symmetry axis.

EP-OS 313 213 discloses a gradient coil system in which at least one of the gradient coils is assembled from a plurality of circular and elliptical segments in such a manner that the dimensions of the inner diameter of these coils (14") in the vertical direction are smaller than those in the horizontal direction. Inside this gradient coil there can still be arranged an RF coil for examinations of the skull which has a diameter of 12". It is also stated that one (or more) of the coils may be assembled from a combination of circular, elliptical or otherwise shaped segments.

SUMMARY OF THE INVENTION

It is an object of the present invention to provide an MR apparatus in which the electric power required for feeding the gradient coil system can be further reduced. This object is achieved according to the invention in that the conductors of the RF coil system which are situated underneath the table top are situated at a distance from the symmetry axis which is smaller than the distance between the symmetry axis and the conductors situated above the table top, and that the cross-section of the gradient coil system is adapted to the cross-section of the RF coil system.

The invention utilizes the fact that the space underneath the table top of the MR apparatus is not available for positioning the patient anyway. Therefore, at this area the conductors of the RF coil system as well as the gradient coil system are situated nearer to the symmetry axis in comparison with the area above the table top. As a result, the power required to feed the gradient coil is reduced in comparison with the power required for an arrangement with a circular cross-section of the RF coil system and the gradient coil system.

For the manufacture of the gradient coil system offers advantages in comparison with a gradient coil system having a circular cross-section.

The embodiment enables a reduction of the electric power required for gradient coils whose magnetic field has a gradient whose direction deviates from the direction of the symmetry axis. Moreover, the spatial homogeneity of the field generated by the RF coil is improved in the direction of the symmetry axis. This is because, the RF magnetic field exhibits a pronounced maximum at its center in the case of a (circular) cylindrical shape of the gradient coil system. This maximum is strongly flattened or widened because at this area the gradient coil, and hence also the RF shield situated on its inner side, is situated at the smallest distance from the RF coil. A further advantage of this arrangement consists in that the so-called patient opening in the MR apparatus becomes wider towards the outside, thus facilitating the access and mitigating the patient's feelings of being locked up.

For a predetermined cross-section of a gradient coil system the isocenter thereof (being the point at which all magnetic fields generated by the gradient coils assume the value zero) can be chosen at will within given limits if the turns of the individual gradient coils extend suitably in space. When the isocenter is situated above the symmetry axis embodiments of the gradient coil system are obtained which are particularly attractive with a view to power requirements.

The magnetic fields produced by the gradient coil system may cause eddy currents in the metal housing in which the main field magnet is accommodated; such eddy currents lead to field distortions. The occurrence of these eddy currents is customarily suppressed by means of active shield which encloses the gradient coil system and includes the same number of coils as the gradient coil system. When these coils are shaped as a circular cylinder whose central axis is coincident with the central axis, in the embodiment of the gradient coils the magnetic field generated in the outer region by the gradient coils will be stronger at the top than at the bottom, so that it could occur that at the top and/or the bottom the magnetic fields of the coils of the shield and the gradient coils can no longer compensate one another.

However, when the density of the turns of the coils of the active shield above the symmetry axis is higher than that therebelow, the magnetic field generated by this coil will also be larger at the top than at the bottom, so that the magnetic field generated in its interior by the corresponding gradient coils is attenuated more above the symmetry axis than below this axis.

BRIEF DESCRIPTION OF THE DRAWINGS

The invention will be described in detail hereinafter with reference to the drawings. Therein.

DESCRIPTION OF THE PREFERRED EMBODIMENTS

Figure 1:
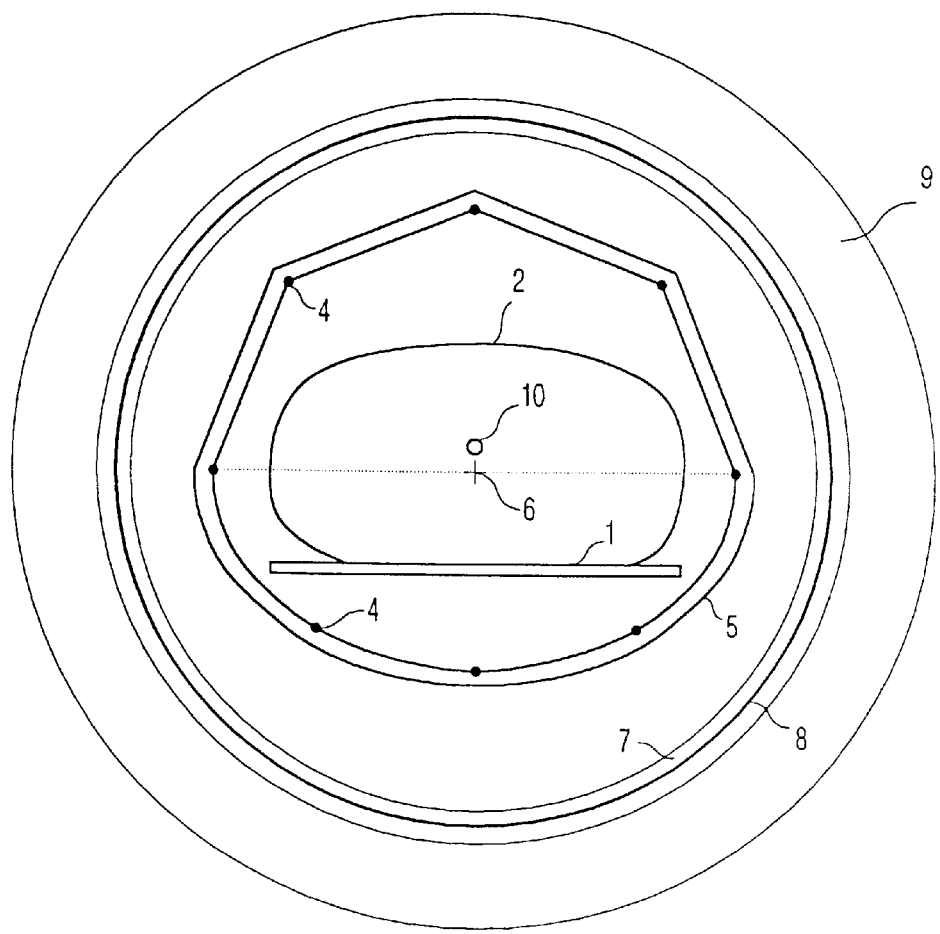
FIG. 1 is a sectional view of an MR apparatus according to the invention.

The reference numeral 1 in FIG. 1 denotes a table top for accommodating an object 2 to be examined, for example a patient. The space available for the examination and the table top are enclosed by an RF coil system (preferably of the birdcage type) which includes eight conductors 4 which extend perpendicularly to the plane of drawing of FIG. 1 and hence are symbolized by a dot in this embodiment. The conductors which are situated above the table top (in a plane perpendicular to a symmetry axis 6) are situated on an arc of a circle around the symmetry axis. The conductors which are situated underneath the table top 1, however, are situated on an elliptical semicircle whose major axis (denoted by dots) extends horizontally. The ends of these conductors are interconnected at both sides via a respective conductor loop whose lower part may be shaped as a semi-ellipse while its upper part is shaped, for example as a polyhedron. The magnetic field generated by this RF coil extends perpendicularly to the plane of drawing. Any other type of RF coil could also be used in principle, for example a so-called saddle coil or a so-called TEM resonator. Such coils also have conductors extending parallel to one another and to the direction of the uniform steady magnetic field.

The RF coil with the conductors 4 is enclosed by a gradient coil system 5. Even though the gradient coil system 5 is represented by a single line in a cross-sectional view, it actually consists of three gradient coils which enclose one another. Each gradient coil includes a layer of conductors which has a thickness of 2.5 mm, said layers being insulated from one another by way of intermediate layers of a thickness of 0.5 mm. On the inner side of the innermost gradient coil there is provided an RF shield (not shown) in the form of a copper foil having a thickness of 15 $\mu$m. The distance between this copper foil and the conductors 4 of the RF coil amounts to approximately 30 mm so that the reduction of the RF magnetic field (or the imposed increase of the RF power required) due to the RF shield can still be tolerated. The shape of the cross-section of the gradient coil is adapted to the situation of the conductors 4 of the RF coil or the shape of the interconnecting conductor loops.

Each of the three gradient coils is capable of generating a respective magnetic field which extends perpendicularly to the plane of drawing of FIG. 1 with mutually perpendicular gradients, i.e. gradients extending in the x direction, the y direction and the z direction. The isocenter 10 of this gradient coil system, that is, the position in which all of said magnetic fields assume the value zero, is situated at the geometrical center of the gradient coil system 5 and above the symmetry axis 6.

Because the conductors of the gradient coil system underneath the table top are situated at a distance from the symmetry axis which is smaller than the distance between this axis and the turns above the table top, for the same magnetic field strength above the table top the electromagnetic energy stored therein is reduced (in comparison with a coil having a circular cross-section and a radius corresponding to the distance between the symmetry axis and the remotest part of the gradient coil system). Therefore, for a given strength and rate of change of the gradient the electric power required for feeding the individual gradient coils is reduced. Consequently, less powerful amplifiers may be used to generate the currents in the gradient coils.

The gradient coil system 5 is enclosed by a tube 7 of a synthetic material which concentrically encloses the symmetry axis 6 and on the exterior of which there is provided a so-called active shield 8 for the gradient coil system 5. The active shield 8 itself consists of three coils which have a circular cross-section which is concentric with the symmetry axis 6; each of said coils is traversed by the same current as each of the gradient coils. Therefore, the magnetic fields of these coils compensate one another in the outer region, i.e. in the metal housing of a cryostat 9, so that practically no eddy currents are generated therein. The cryostat 9 accommodates a superconducting magnet (not shown) which generates a steady magnetic field which extends perpendicularly to the plane of drawing and is uniform to a high degree, that is, at least in the region enclosed by the lining 3. For the sake or clarity the drawing does not show the mechanical connection between the cryostat 9 and the components 3 to 8.

Because the surface area of the gradient coil system 5 is smaller and the active shield 8 still has a circular cross-section, the flux required in the shield 8 so as to compensate the magnetic field of the gradient coil system 5 in the cryostat 9 is also reduced. The power required for the gradient coil system 5 (and the shield 8) is thus reduced even further.

Figure 2:
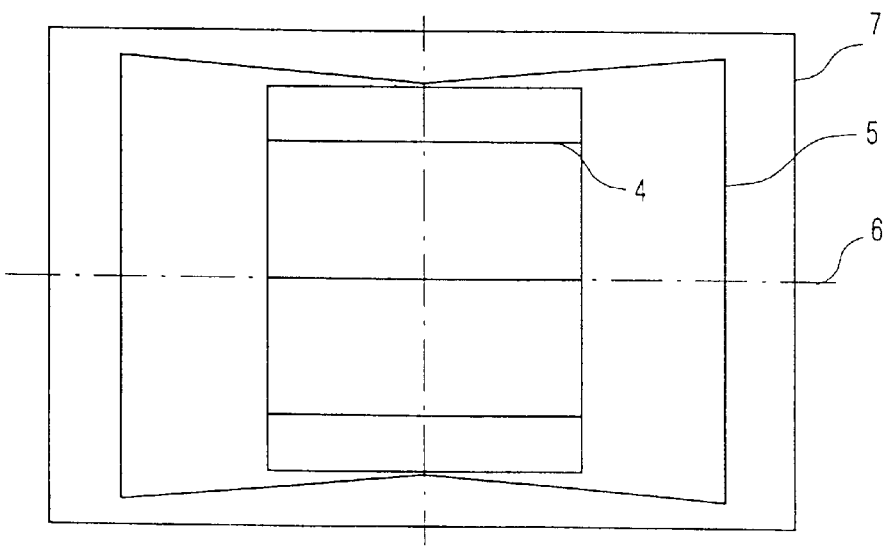
FIG. 2 is a sectional view of a further embodiment.

The gradient coils customarily have a cross-section which is constant in the direction perpendicular to the symmetry axis, i.e. independent of the position on the symmetry axis. This may also be the case for the arrangement according to the invention. FIG. 2, however, shows a sectional view through an MR apparatus in a plane containing the symmetry axis 6 in a modified embodiment of the invention. The shape of the cross-sections of the gradient coil system and the RF coil is the same as shown in FIG. 1.

The gradient coil system 5, however, does not have a straight longitudinal cross-section (that is, the cross-section in a plane containing the central axis), but a longitudinal cross-section which increases conically from the center of the RF coil towards the periphery. The gradient coil system 5, and hence the RF shield which is arranged on its inner side and is not shown, is particularly close to the RF coil 4 in the central plane as a result of this geometry; consequently, the RF shield attenuates the RF magnetic field in this region more strongly than outside this region. As a result, the maximum of the RF magnetic field in this region will be flatter than usual, that is, the spatial homogeneity of the RF magnetic field is enhanced in the direction of the central axis. An additional advantage is obtained in that the lateral openings of the gradient coil system are enlarged so that locally more space is available for the patient, provided that the lining (not shown in FIG. 4) follows this geometry.

Figure 3:
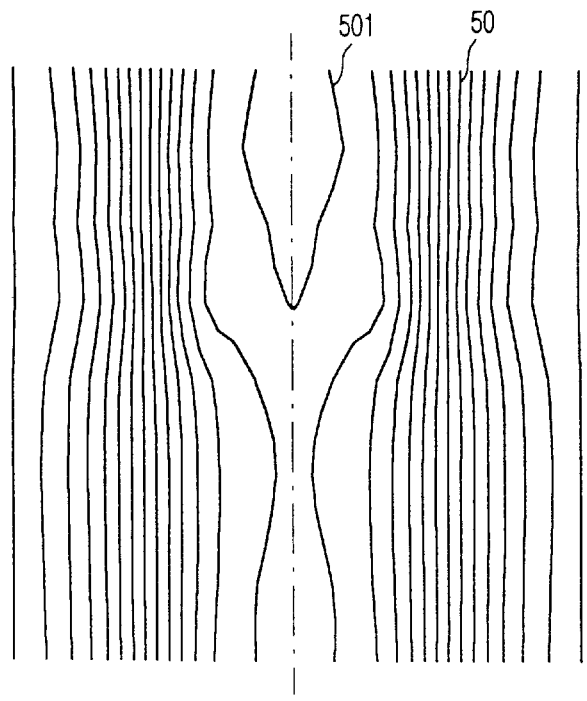
FIG. 3 illustrates the arrangement in space of the turns on a development of a gradient coil.
Figure 4:
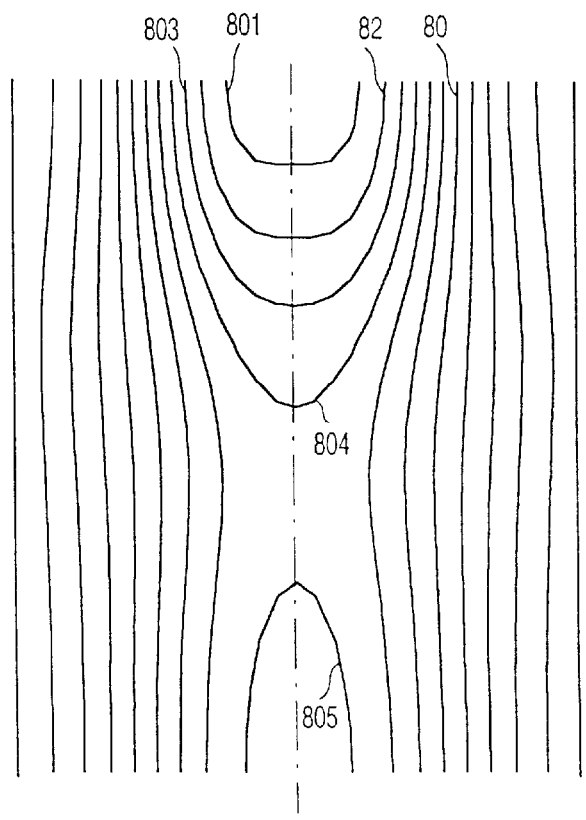
FIG. 4 shows the arrangement in space of the turns in a development of the associated coil of the active shield.

When the gradient coil system has a cross-section of a shape other than circular, the spatial constancy of the gradient of the magnetic field is reduced. This can be avoided, however, when the paths of the conductors of the individual gradient coils follow a suitable course which deviates from the courses customarily used thus far. This will be described in detail hereinafter with reference to the FIGS. 3 and 4. These drawings show the development of the right-hand half of the gradient coil with gradients extending in the direction of the symmetry axis (FIG. 3) and of that coil of the active shield 8 which is traversed by the same current and compensates the magnetic field of the gradient coil in the outer region (FIG. 4). The developments are shown at a different scale.

The conductor paths which are situated adjacent one another in a single turn are symbolized by a stroke. In reality, however, the width of these conductor paths is greater. The individual turns are successively traversed by the same current, that is, in such a manner that the turns or turn segments which are situated to the left of the symmetry plane are traversed by this current in the same direction, whereas the turns or turn segments at the right-hand side are traversed by the current in the opposite direction, thus producing the desired gradient. It is a common aspect of these coils and conventional coils that the number of turns 80 in the coil belonging to the active shield (FIG. 3) is smaller than the number of turns 50 in the gradient coil (FIG. 4). This is due to the fact that the coils of the active shield are situated nearer to the cryostat, so that less electrical flux or fewer turns are required so as to generate a magnetic field which has the same strength in the inner wall of the cryostat, (but the opposite direction) as the magnetic field generated by the gradient coil.

Unlike the situation in conventional coils, however, the individual turns are not situated in a plane extending perpendicularly to the symmetry axis (ignoring the outer turns for which this is approximately the case) and they do not extend helically. There are notably formed turn loops 801 . . . 805 or 501 as otherwise used only in gradient coils having a gradient in a direction perpendicular to the symmetry axis. These turn loops increase the number of turns, that is, more at the top (these turns are also situated also above the table top) than at the bottom.

This is because above the table top 1 the turns 50 are situated nearer to the turns 80 of the coil in the active shield than underneath the table top (see FIG. 1). Therefore, above the table top 8, more turns, or a higher electric flux, are required so as to compensate the field of the gradient coil 5. Because the coil of the active shield comprises more turns above the table top than underneath the table top and because the turns at the top are situated nearer to the isocenter 10 than the turns at the bottom, the magnetic field generated at the isocenter by the turns at the top is stronger than the oppositely directed field which is generated by the turns situated at the bottom. In order to counteract this phenomenon the gradient coil situated above the table top must have more turns than underneath the table top, even when (as shown in FIG. 1) the isocenter 10 is situated halfway between the upper and the lower turns. However, the ratio of the number of turns at the top to that at the bottom in the gradient coil is smaller than in the coil of the active shield. For the two other gradient coils, each generating a respective magnetic field with gradients extending perpendicularly to one another and to the symmetry axis, it also holds that the numbers of turns of the gradient coils above the table top must be larger than underneath.

When the conductors 4 of the RF coil are arranged around the isocenter 10 in the manner shown in FIG. 1, that is, not regularly distributed on the circumference of a circle, a spatially inhomogeneous RF magnetic field may occur, because some conductors are situated nearer to the isocenter than others. This can be simply counteracted by arranging said RF shield (not shown in the drawing), and possibly also the gradient coil, slightly closer to the conductors 4 which are situated at a smaller distance from the isocenter.

What is claimed is:

1. An MR apparatus comprising:
    a cylindrical main field magnet for generating a uniform, steady magnetic field whose cylindrical shape defines a symmetry axis,
    a gradient coil system which encloses the symmetry axis and includes a plurality of gradient coils,
    an RF coil system which is situated inside the gradient coil system and which includes a plurality of mutually offset conductors which extend parallel to the symmetry axis, and
    a table top for accommodating an object to be examined, wherein the conductors of the RF coil system which are situated underneath the table top are disposed from the symmetry axis at a distance which is smaller than the distance between the symmetry axis and the conductors which are disposed above the table top, and that a shape of a cross-section of the gradient coil system coincides with a shape of a cross-section of the RF coil system.

2. An MR apparatus as claimed in claim 1, wherein the cross-section of the gradient coil system is shaped, at least over a part of its circumference, as a polyhedron whose corners are situated in the vicinity of each one of the conductors.

3. An MR apparatus as claimed in claim 1, wherein the gradient coil system widens in a direction of the symmetry axis towards the periphery at both sides.

4. An MR apparatus as claimed in claim 1 wherein turns of the coils of the gradient coil system extend in space in such a manner that the isocenter is situated above the symmetry axis.

5. An MR apparatus as claimed in claim 1 further comprising an active shield which encloses the gradient coil system and which includes a plurality of coils in order to generate magnetic fields which compensate the magnetic fields generated by the gradient coils in the outer region, wherein the density of the turns of the coils of the active shield above the symmetry axis is higher than the density of the turns of the coils of the active shield below the symmetry axis.

6. An MR apparatus as claimed in claim 5, wherein the density of the turns of the gradient coils above the symmetry axis is higher than the density of the turns of the gradient coils below the symmetry axis.

7. A gradient system for an MR apparatus which encloses an RF coil system which includes a plurality of mutually offset conductors which extend parallel to the central axis, wherein a first part of the plurality of mutually offset conductors of the RF coil system are situated on an arc of a circle whose radius is larger than the distance between a second part of the plurality of mutually offset conductors and the center of the circle, and that a shape of a cross-section of the gradient coil system coincides with a shape of a cross-section of the RF coil system.

8. A gradient coil system for an MR apparatus which encloses an RF coil system which includes a plurality of mutually offset conductors which extend parallel to the central axis wherein a first group of the plurality of conductors of the RF coil system are situated on an arc of a circle and a second group of the plurality of conductors are situated on an arc of an elliptical semi-circle, the circle having a radius that is larger than each cord of the elliptical semi-circle such that the distance between the conductors of the circle and the center of the circle is greater than the distance between the conductors of the elliptical semi-circle and the center of the circle, and wherein a cross-section of the gradient coil system coincides with a cross-section of the RF coil system.

* * * * *